United States Patent [19]
Kamikawa et al.

[11] Patent Number: 5,445,699
[45] Date of Patent: Aug. 29, 1995

[54] PROCESSING APPARATUS WITH A GAS DISTRIBUTOR HAVING BACK AND FORTH PARALLEL MOVEMENT RELATIVE TO A WORKPIECE SUPPORT SURFACE

[75] Inventors: Yuuji Kamikawa, Uto; Kimiharu Matsumura, Kumamoto; Masafumi Nomura, Kumamoto; Junichi Nagata, Kumamoto, all of Japan

[73] Assignee: Tokyo Electron Kyushu Limited, Kumamoto, Japan

[21] Appl. No.: 145,663

[22] Filed: Nov. 4, 1993

Related U.S. Application Data

[63] Continuation of Ser. No. 902,555, Jun. 22, 1992, abandoned, which is a continuation of Ser. No. 538,711, Jun. 15, 1990, abandoned.

[30] Foreign Application Priority Data

Jun. 16, 1989 [JP] Japan .................................. 1-154117
Aug. 28, 1989 [JP] Japan .................................. 1-220969
Aug. 29, 1989 [JP] Japan .................................. 1-222467

[51] Int. Cl.6 ............................................. C23C 16/52
[52] U.S. Cl. ................................. 156/345; 118/715; 118/723 R; 118/724; 118/725; 118/729
[58] Field of Search ............ 118/715, 723 R, 723 ER, 118/723 IR, 723 ME, 724, 725, 729; 156/345, 643; 204/298.29

[56] References Cited

U.S. PATENT DOCUMENTS

| 3,681,132 | 8/1972 | Pammer et al. | 264/81 |
| 3,890,176 | 6/1975 | Bolon | 156/646 |
| 4,590,042 | 5/1986 | Drage | 156/345 |
| 4,604,020 | 8/1986 | Toro Lira et al. | 414/217 |
| 4,664,935 | 5/1987 | Strahl | 427/255.5 |
| 4,807,561 | 2/1989 | Ebata | 118/729 |
| 4,834,020 | 5/1989 | Bartholomew et al. | 118/715 |
| 4,857,142 | 8/1989 | Syverson | 156/345 |
| 4,872,947 | 10/1989 | Wang et al. | 156/345 |
| 4,908,095 | 3/1990 | Kagatsume et al. | 156/345 |
| 4,987,856 | 1/1991 | Hey et al. | 118/715 |
| 5,000,113 | 3/1991 | Wang et al. | 118/715 |
| 5,030,057 | 7/1991 | Nishi et al. | 118/500 |

FOREIGN PATENT DOCUMENTS

| 0272142 | 6/1988 | European Pat. Off. | 156/345 |
| 61119341 | of 0000 | Japan . | |
| 51-20356 | 6/1976 | Japan | 427/255.5 |
| 61-53718 | 3/1986 | Japan | 118/715 |
| 61-208222 | 9/1986 | Japan . | |
| 63-6831 | 1/1988 | Japan | 118/729 |
| 63-38573 | 2/1988 | Japan | 118/715 |
| 63-70429 | 3/1988 | Japan | 156/345 |
| 63-124528 | 5/1988 | Japan . | |
| 63-260034 | 10/1988 | Japan | 156/345 |

OTHER PUBLICATIONS

Christensen, R. G., "Method and Apparatus for Depositing Resists", IBM Technical Disclosure Bulletin, vol. 20, No. 10 (Mar. 1978) pp. 3913-3914.

Primary Examiner—Terry J. Owens
Attorney, Agent, or Firm—Oblon, Spivak, McClelland, Maier & Neustadt

[57] ABSTRACT

A processing apparatus comprising a reaction chamber, a workpiece-supporting section located in the reaction chamber for supporting a workpiece, a gas distributor located in the reaction chamber and facing the workpiece-supporting section for distributing reaction gas to a workpiece that is on the supporting surface of the workpiece-supporting section, a gas supply for supplying the reaction gas into the reaction chamber through the gas distributor and at a predetermined pressure, and a drive mechanism for moving the gas distributor back and forth relative to the workpiece-supporting section in a direction that is parallel to the supporting surface of the workpiece-supporting section. The speed of the relative movement can be varied and the reaction gas flow rate can be controlled in accordance with the speed the relative movement or the position of the gas distributor with respect to the workpiece-supporting sector during the relative movement.

14 Claims, 12 Drawing Sheets

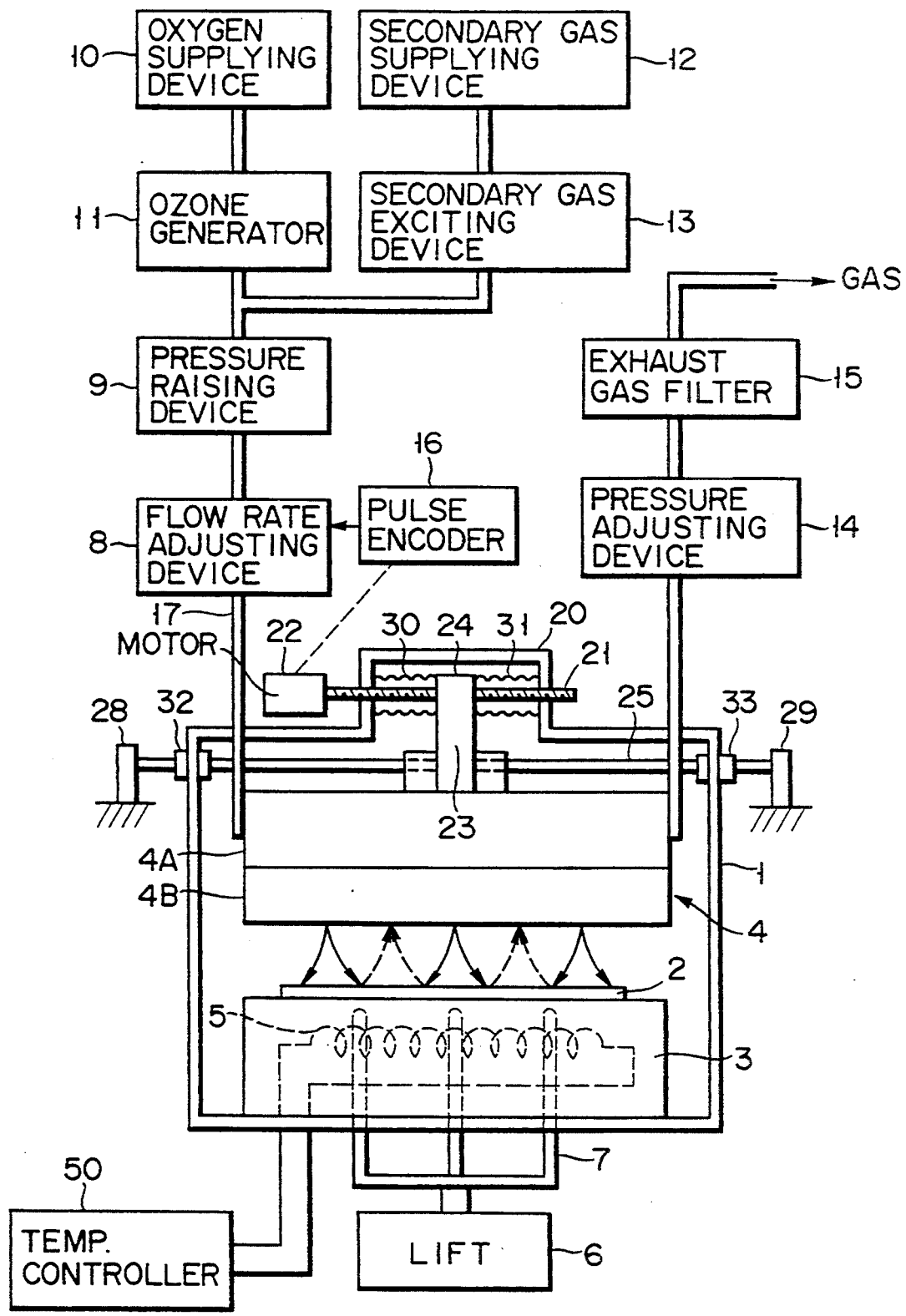
F I G. 1

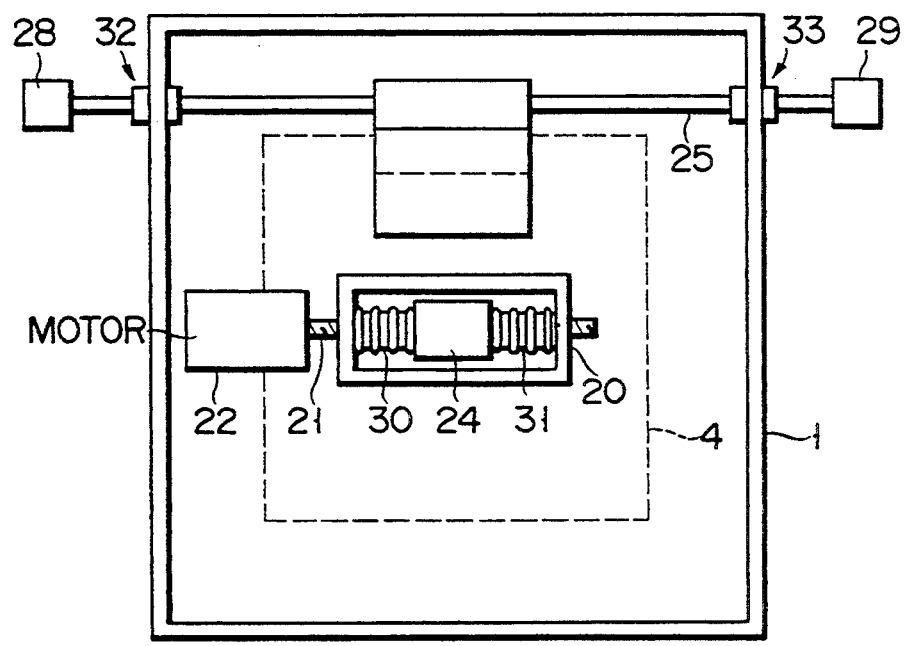
F I G. 2
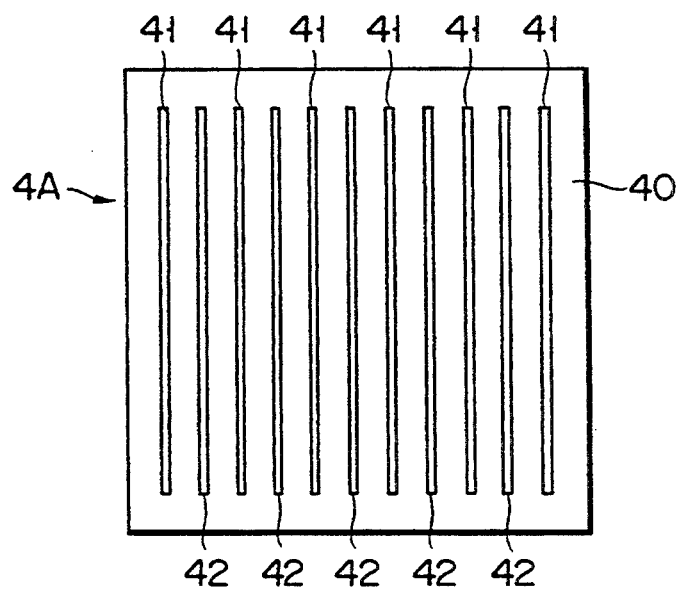
F I G. 3

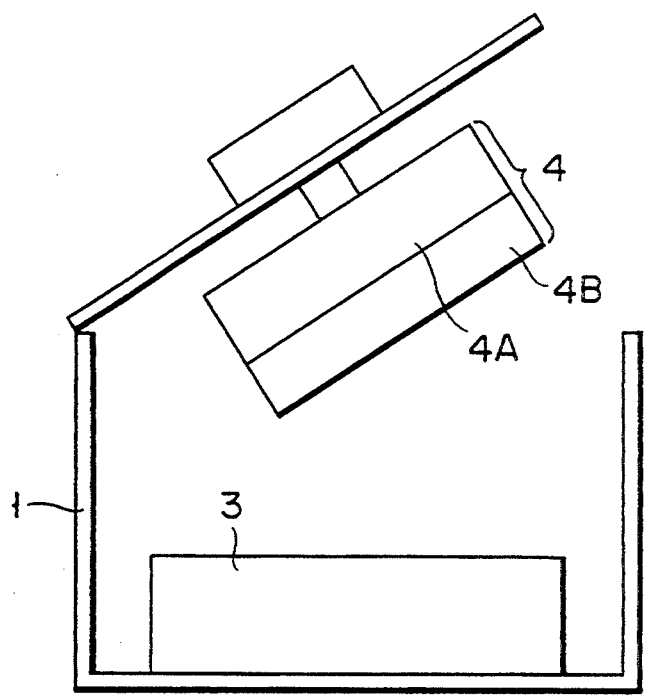
F I G. 4
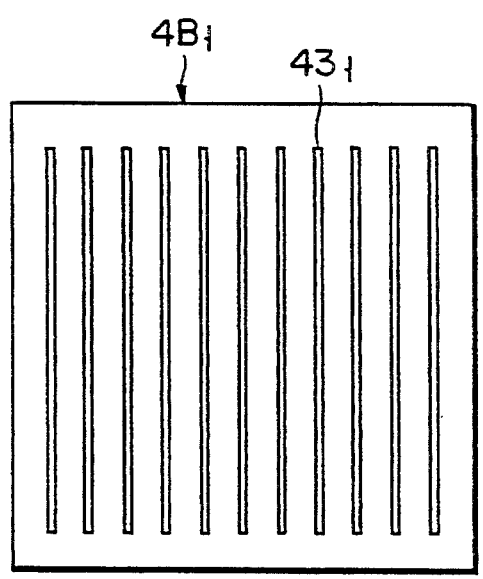
F I G. 5

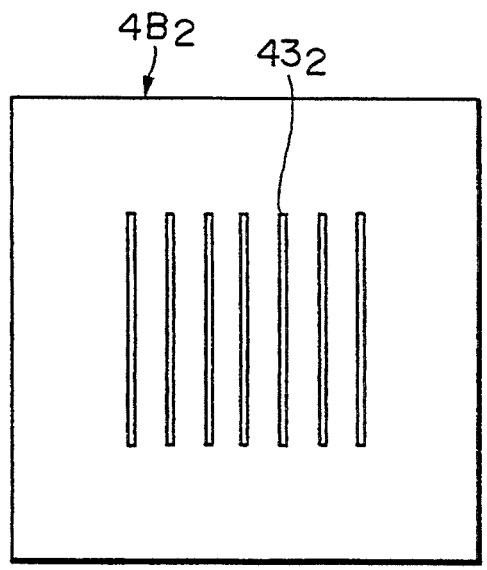
F I G. 6
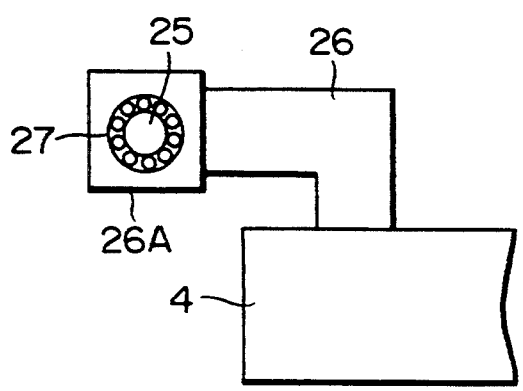
F I G. 7
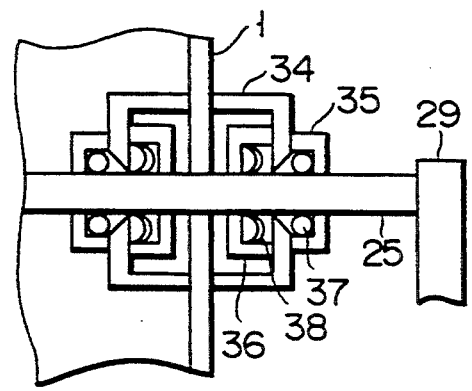
F I G. 8

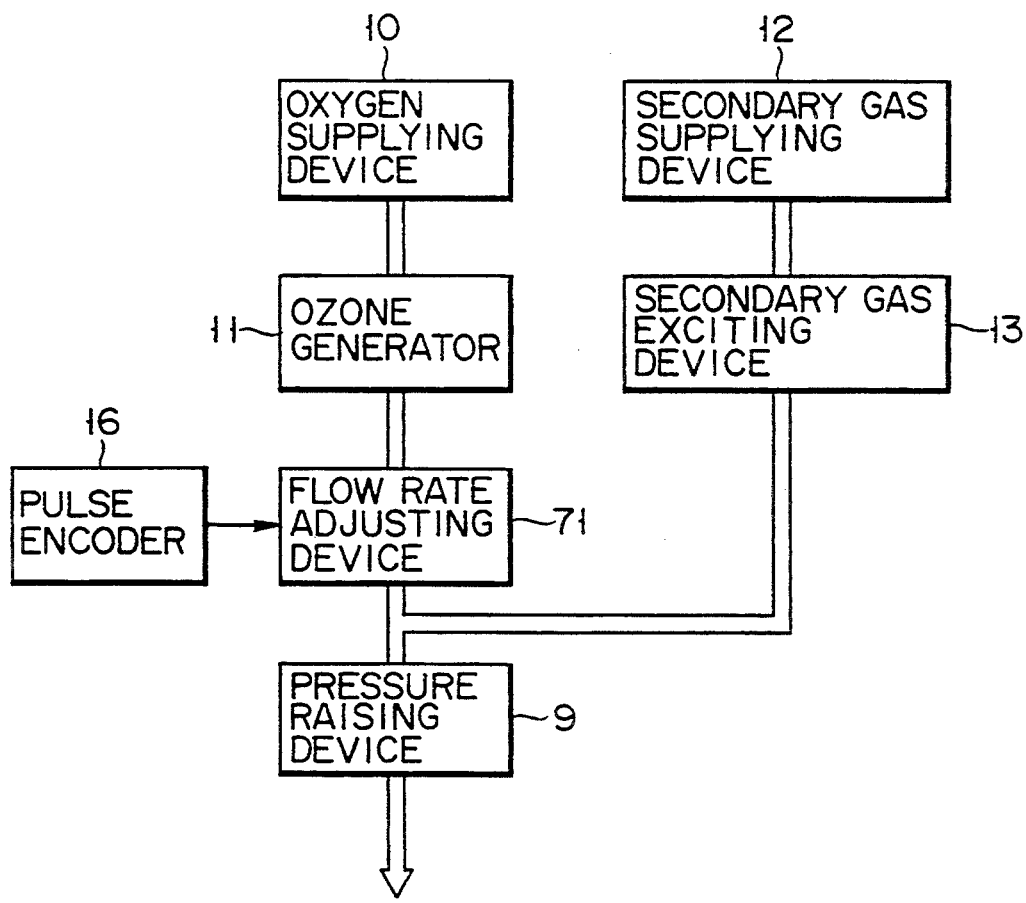
F I G. 12

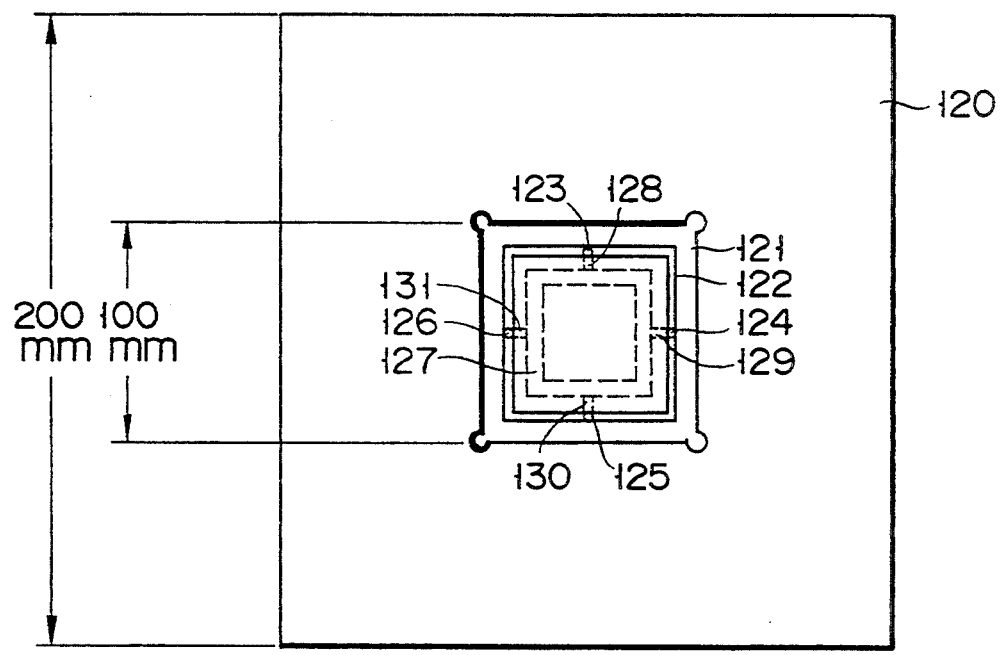
F I G. 19
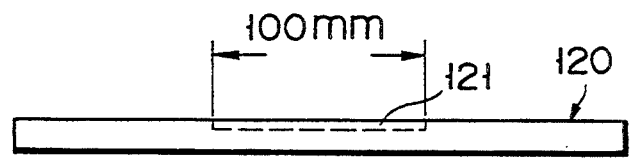
F I G. 20

PROCESSING APPARATUS WITH A GAS DISTRIBUTOR HAVING BACK AND FORTH PARALLEL MOVEMENT RELATIVE TO A WORKPIECE SUPPORT SURFACE

This application is a Continuation of application Ser. No. 07/902,555, filed on Jun. 22, 1992, now abandoned, which is a continuation of Ser. No. 07/538,711, filed on Jun. 15, 1990, also abandoned.

BACKGROUND OF THE INVENTION

1. Field of the Invention

The present invention relates to an apparatus for processing workpieces such as semiconductor wafers or liquid-crystal display (LCD) substrates, and also a method of processing such workpieces.

2. Description of the Related Art

One of the steps of manufacturing semiconductor device is to etch the surface region of a semiconductor substrate covered by a photoresist film, thereby forming a fine pattern on the substrate. After this step, it is necessary to remove from the substrate the photoresist film which has been used as an etching mask. To remove the photoresist film, so-called ashing processing has been used hitherto.

Ashing process is advantageous in that only unnecessary parts of the photoresist film can be removed from the substrate, without scratching or damaging the surface of the substrate. This process is also employed to wash masks and silicon wafers and to remove ink or residual solvent therefrom. Further, it is suitable as a dry cleaning process which is performed in manufacturing semiconductor devices.

Published Unexamined Japanese Patent Application 52-20766 discloses an ashing apparatus which applies an ozone-containing gas to the surface of a semiconductor substrate. The apparatus comprises a chamber, and an electric heater, a heating plate, and a gas distributor all located within the chamber. The electric heater is positioned below the heating plate, for heating the heating plate. The gas distributor is located above the heating plate and has nozzles when heated by the heater, the heating plates radiates heat. The heat serves to form in the chamber an ashing-gas atmosphere of 1 atmospheric pressure or lower pressure in the chamber. The gas distributor uniformly applies the ozone-containing ashing gas through its nozzles to the surface of a semiconductor water mounted on the heating plate. More precisely, the ashing gas is applied onto the photoresist film formed on the semiconductor wafer, and reacts with the photoresist which is high-molecular organic substance, causing the same to peel off the semiconductor wafer.

In recent years, larger and larger semiconductor substrates are used to manufacture semiconductor devices. For example, the LCD substrate used at present are square glass plates, each side of which is about 300 mm long. The larger the semiconductor substrates, the more important it is to apply the ashing gas uniformly to the entire surface of each substrate. Here is a problem. Since the nozzles of the gas distributor take specific positions with respect to the semiconductor substrate which is to be processed, the gas is inevitably applied to the portions of the substrate in different concentrations. Consequently, portions of the substrate undergo ashing to different degrees, in particular when the semiconductor substrate is relatively large.

In the conventional ashing apparatus, described above, an ozone-containing ashing gas is applied to a semiconductor substrate in an atmosphere of 1 atmospheric pressure or a lower pressure. The ashing gas, which contains ozone, can help to achieve ashing processing, but at a comparatively low speed. Therefore, it is generally adopted to get a high temperature at the ashing treatment or to get a high concentration of a treatment gas so as to improve the ashing treatment speed. However, these means are undesirable since the substrate material is damaged and the apparatus cost becomes high.

Various methods of processing semiconductor substrates are known. One of these methods is to apply ultraviolet rays from an ultraviolet-ray source to a semiconductor substrate placed within a CVD-gas atmosphere, thus depositing a film on the substrate. Another of these methods is to apply ultraviolet rays to a semiconductor substrate in an etching-gas atmosphere, thereby etching the surface region of the substrate. The efficiency of either method is low, and requires a huge space and a proportionally large apparatus.

SUMMARY OF THE INVENTION

An object of the present invention is to provide both an apparatus and a method which can apply a processing gas uniformly to the surface of a relatively large workpiece, thereby processing any portions of the workpiece to the same degree and at high speed.

Another object of this invention is to provide an apparatus which is small but can process workpieces at high efficiency.

According to the present invention, there is provided a processing apparatus which comprises: a reaction chamber; a workpiece-supporting section located in the chamber and having a supporting surface, for supporting a workpiece; a gas distributor located in the chamber and facing the workpiece-supporting section, for distributing reaction gas to a workpiece placed on the supporting surface of the supporting section; gas-supplying means for supplying the reaction gas into the chamber through the gas distributor under a predetermined pressure; and drive means for moving the gas distributor relative to the workpiece-supporting section in a direction parallel to the supporting surface of the workpiece-supporting section.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a side view illustrating an ashing apparatus according to a first embodiment of this invention;

FIG. 2 is a plan view showing a section of the ashing apparatus shown in FIG. 1;

FIG. 3 illustrates that side of the gas-distributing plate of the ashing apparatus, to which an adaptor is attached;

FIG. 4 is a diagram showing how a top plate is fastened to the reaction chamber of the apparatus shown in FIG. 1;

FIG. 5 is a plan view of the adaptor;

FIG. 6 is a plan view of another type of an adaptor which can be incorporated in the apparatus shown in FIG. 1;

FIG. 7 is a sectional view showing the connection arm attached to the gas distributor;

FIG. 8 illustrates the seal member used in the ashing apparatus shown in FIG. 1;

FIG. 12 is a block diagram showing another type of a flow rate adjusting device which can be incorporated into the ashing apparatus shown in FIG. 1;

FIG. 19 is a plan view showing another type of a tray which can be used in the apparatus shown in FIG. 15; and FIG. 20 is a side view of the tray shown in FIG. 19.

DETAILED DESCRIPTION OF THE PREFERRED EMBODIMENTS

Embodiment 1

Figure 9:
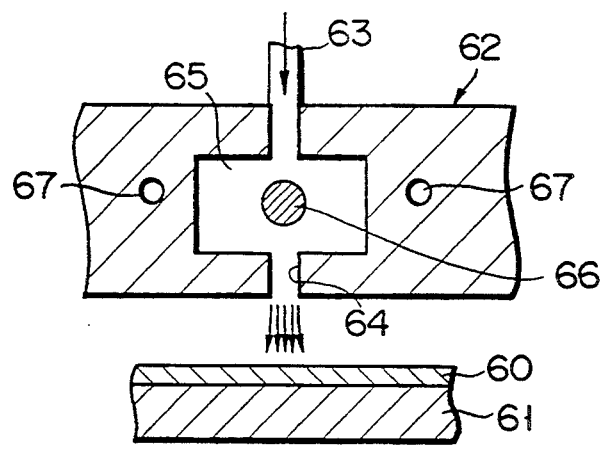
FIG. 9 is a sectional view showing a section of an ashing apparatus according to a second embodiment of the present invention.

An ashing apparatus according to a first embodiment of the present invention will now be described, with reference to the accompanying drawings.

FIG. 1 is a side view of the ashing apparatus, and FIG. 2 is a plan view showing a section of the ashing apparatus. As is shown in these figures, the ashing apparatus comprises a reaction chamber 1, a heating plate 3 located on the bottom of the chamber 1, for supporting a semiconductor wafer 2, and a gas distributor 4 also located within the chamber 1 and above the heating plate 3.

The heating plate 3 is made of a metal such as stainless steel (SUS) or aluminum. An electric heater 5 is embedded in the plate 3, for heating the plate 3. When heated by the heater 5, the plate 3 heats the semiconductor wafer 2 placed on it. The bottom of the chamber 1 and the heating plate 3 have several through holes (e.g., three holes). Several vertical pins 7 (e.g., three pins) are inserted in these holes, and are connected, at the lower end, to a substrate lift 6 which is located below the chamber 1. The lift 6 is designed to move the pins 7 upward and project them from the upper surface of the plate 3, thereby to unload the wafer 2 from the plate 3, and also to move the pins 7 downward and pull them back into the holes, thereby to load the wafer 2 onto the plate 3.

As is shown in FIG. 1, the gas distributor 4 comprises a gas-distributing plate 4A and an adapter 4B which is connected to the plate 4A by means of, for example, screws. The adapter 4B can be replaced by an adapter of another type in order to distribute an ashing gas to a semiconductor wafer of a different size at such a flow rate as to ash the wafer with a sufficiently high efficiency.

FIG. 3 illustrates that side of the gas-distributing plate 4A of the ashing apparatus, to which the adaptor 4B is fastened. As this figure shows, the gas-distributing plate 4A has a number of gas supplying grooves 41 and a number of gas-exhausting grooves 42, which are parallel to one another and arranged alternately. Each groove is 1 mm wide, 20 mm interval and 360 mm long. For example, the plate 4A has ten gas-supplying slits 41, and eleven gas-exhausting slits 42 in the case of the apparatus for 350 mm square substrate.

It is important to arrange gas-supplying slit 41 and gas-exhausting slit 42 alternately. Therefore, an concentric arrangement of these slit 41, 42 can be adopted.

Instead of the above mentioned slits 41, 42 a means which has a function so as to work as the gas-supplying holes and gas-exhausting holes and made of sintered material may be used.

The adapter 4B is either the one shown in FIG. 5 or the one shown in FIG. 6. The adapter $4B_1$ shown in FIG. 5 has gas-distributing slits $43_1$ in the same number as the gas-supplying grooves 41 of the plate 4A, and gas-exhausting slits $43_2$ in the same number as the gas-exhausting grooves 42 of the plate 4A. The adapter $4B_2$ shown in FIG. 6 has gas-distributing slits $43_1$ less and shorter than the gas-supplying grooves 41 of the plate 4A, and gas-exhausting slits $43_2$ less and shorter than the gas-exhausting grooves 42 of the plate 4A. The adapter 4B, whichever type, is positioned with respect to the gas-distributing plate 4A, such that its gas-distributing slits and gas-exhausting slits align with the gas-supplying grooves 41 and the gas-exhausting grooves 42, respectively. Further, the adapter 4B may be any other one whose gas-distributing and gas-exhausting slits have such a length and provided in such a number, as is suitable for the size of the semiconductor wafer to be subjected to ashing.

As is shown in FIG. 4, the top wall of the reaction chamber 1 can rotate between a closed position and an opened position when it is rotated to the opened position, it allows access to the gas distributor 4, whereby the adapter 4B can be removed from the plate 4A, and another can be fastened to the plate 4A by means of screws. The adapter 4B is replayed by another which is suitable for uniformly distributing the ashing gas to the next semiconductor wafer of a different size. More specifically, the adapter 4 is replaced by the adapter shown in FIG. 5 if the wafer to be ashed next is large, or by the adapter shown in FIG. 6 if the wafer to be ashed next is small.

Since one adapter is selected from many in accordance with the size of the semiconductor wafer to be ashed next, the ashing gas is applied to the wafer with high efficiency, without wasting the ashing gas.

As is illustrated in FIG. 1, the gas-supplying grooves 41 of the gas-distributing plate 4A are connected to a flow rate adjusting device 8, which in turn is connected to a pressure raising device 9. The device 9 is a pressure-raising pump such as a plunger pump, a bellows pump, or a diaphragm pump. The pressure-raising device 9 is coupled to an ozone generator 11 and also to a secondary gas exciting device 13. The ozone generator 11 generates ozone by means of silent discharge, corona discharge, or glow discharge.

The gas-exhausting grooves 42 of the gas-distributing plate 4A are connected to a pressure adjusting device 14, which in turn is coupled to an exhaust gas filter 15. The exhaust gas filter 15 is connected to an exhaust system installed in a factory.

As is understood from FIGS. 1 and 4, the top wall of the reaction chamber 1 bulges upward, forming a sub-chamber 20. A ball screw 21 extends through the sub-chamber 20 and passes through two opposing walls thereof, in a direction parallel to the top surface of the heating plate 3 and at right angles to the axes of the gas-distributing slits and gas-exhausting slits of the adapter 4B. The ball screw 21 is connected at one end to an electric motor 22 and can be rotated thereby. A suspension 23 is connected at lower end to the upper surface of the gas distributor 4, and the upper end 24 of the suspension 23 is set in screw engagement with the ball screw 21.

A rod 25 extends parallel to the ball screw 21, and passing through the opposing walls of the reaction chamber 1. The rod 25 functions as a rail for guiding the gas distributor 4 horizontally. As is illustrated in FIG. 7, an arm 26 is fastened to the upper surface of the gas distributor 4. The upper portion 26A of the arm 26 has a through hole, in which a bearing 27 is fitted. The rod 25 extends through this bearing 27 and is fastened at one end by a post 28 and at the other end by a post 29. Hence, the gas distributor 4 can be moved horizontally, along the rod 25.

when the motor 22 drives the ball screw 21, the gas distributor 4 is moved along the ball screw 21, that is, in a line intersecting with the gas-distributing slits and the gas-exhausting slits, to the left or the right according to the direction in which the motor 22 rotates the ball screw 21.

The reaction chamber 1 should be sealed airtight, in order to create a high-pressure atmosphere within it, which is required to ash the semiconductor wafer 2 successfully. To this end, as is shown in FIG. 1, a first set of bellows 30 is interposed between the suspension 23 and the left-side wall of the sub-chamber 20, covering that portion of the ball screw 21 which extends between the suspension 23 and the left-side wall, and a second set of bellows 31 is interposed between the suspension 23 and the right-side wall of the sub-chamber 20, covering that portion of the ball screw 21 which extends between the suspension 23 and the right-side wall. Further, a first seal member 32 seals the gap between the rod 25 and the hole made in the left-side wall of the chamber 1 and allowing the passage of the rod 25, and a second seal member 33 seals the gap between the rod 25 and the hole made in the right-side wall of the chamber 1 and allowing the passage of the rod 25. Therefore, the reaction chamber 1 is made airtight, despite of the clearance, though small, which exists between the ball screw 21 and the hole made in either side wall of the sub-chamber 20, and despite of the gas between the rod 25 and the hole made in either side-wall of the reaction chamber 1.

The seal members 32 and 33 are identical in structure. Thus, only the seal member 33 will be described in detail, with reference to FIG. 8. As FIG. 8 shows, the seal member 33 comprises two identical parts fitted on the outer and inner surfaces of the right-side wall of the chamber 1, respectively. Either part comprises three cups 34, 35, and 36, each having a through hole having the same diameter as the rod 25. The cup 34 is larger than cups 35 and 36, fitted to the side wall of the chamber 1, and mounted on the rod 25. The rim of the hole made in the cup 34 is inclined, such that the bottom wall of the cup 34 becomes thinner toward the axis of the rod 25. The cups 35 and 36 are mounted on the rod 25, and located outside and inside the cup 34, respectively. In the cup 35, an O-ring 37 is mounted on the rod 25. In the cup 36, a resilient seal 38 is mounted on the rod 25, compressed between the rod 25 and the inner periphery of the cup 36.

A lift may be used to move the gas distributor 4, toward and away from the semiconductor wafer 2 placed on the heating plate 3, so that the distance between the wafer 2 and the gas distributor 4 can be adjusted to any desired value.

As is shown in FIG. 1, the pressure raising device 9 is connected to the gas-supplying grooves 41 by the flow rate adjusting device 8. The device 8 is designed to adjust the flow rate of the ashing gas supplied to the gas distributor 4 in accordance with the speed at which the gas distributor 4 is moved parallel to the surface of the semiconductor wafer 2. More precisely, the device 8 adjusts the flow rate of the ashing gas in accordance with the pulses generated by a pulse encoder 16 coupled to the shaft of the motor 22. The pulse encoder 16 has magnetic means or optical means, which generates pulses at a frequency proportional to the speed of the motor 22, and hence proportional to the speed of the gas distributor 4 driven by the motor 22.

Figure 10:
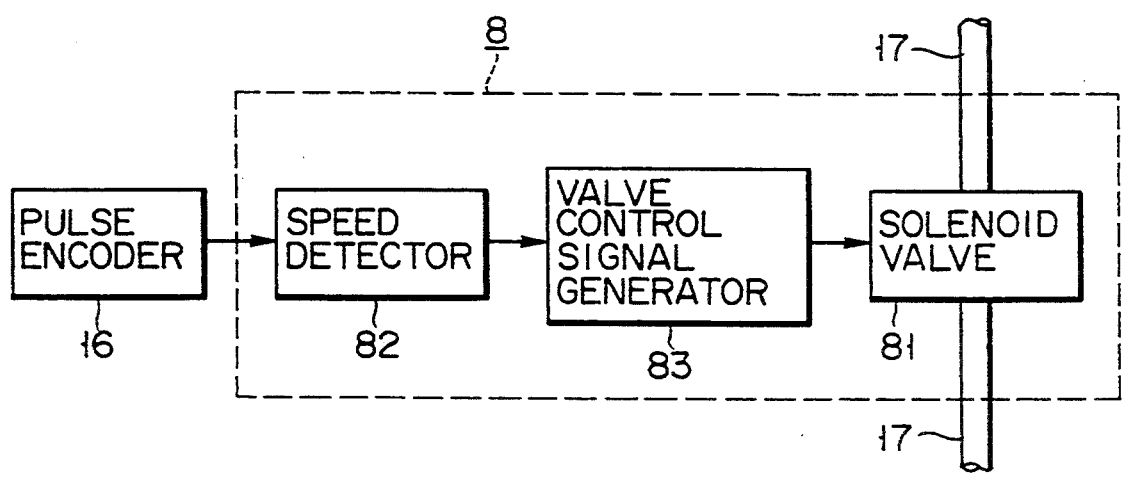
FIG. 10 is a block diagram illustrating the flow rate adjusting device incorporated in the ashing apparatus shown in FIG. 1.

FIG. 10 is a block diagram illustrating the flow rate adjusting device 8. As is shown in this figure, the device 8 comprises a solenoid valve 81 connected on a gas-supplying tube 17, a speed detector 82 connected to the pulse encoder 16, and a valve control signal generator 83 coupled between the solenoid valve 81 and the speed detector 82. The valve 81 controls the flow rate of the gas supplied through the tube 17 in accordance with the signals output by the valve control signal generator 83. The speed detector 82 receives the pulses from the pulse encoder 16, detects the speed of the gas distributor 4 from the intervals between the pulses, and generates a speed signal representing the speed. The speed signal is supplied to the valve control signal generator 83. The signal generator 83 processes the speed signal, generating a valve control signal for causing the solenoid valve 81 to change the flow rate of the gas in direct proportion to the speed of the gas distributor 4. The valve control signal is input to the solenoid valve 81, whereby the valve 81 controls the flow rate of the gas supplied through the tube 17.

It will now be explained how the ashing apparatus, described above, is operated to perform ashing on a semiconductor wafer 2.

First, the semiconductor wafer 2, which has been preheated to 50° to 150° C. in a pre-heating chamber (not shown), is brought into the reaction chamber 1 by means of a conveyer device (not shown, either). At this time, the pins 7 are projected upward from the heating plate 3 by means of the substrate lift 6. Hence, the wafer 2 is placed on the upper tips of the pins 7.

Then, the arm of the conveyer is retreated from the reaction chamber 1. The substrate lift 6 lowers the pins 7, whereby the semiconductor wafer 2 is placed onto the heating plate 3. The heating plate 3 is heated to 150° to 250° C. or to 200° to 300° C. by means of the electric heater 5. Ashing of the wafer 1 is then started within the reaction chamber 1. More specifically, the plate 3 heats the semiconductor wafer 2, and the gas containing the ozone generated by the ozone generator 11 is supplied to the pressure raising device 9, and the secondary gas is simultaneously supplied to the device 9 from the secondary gas exciting device 13. The device 9 increases the pressure of these gases, mixed together, to 2 to 20 ata. The mixture gas, thus pressurized, is supplied to the flow rate adjusting device 8, which adjusts the flow rate of the mixture gas to 3 to 30 l/min. The mixture gas, i.e., ashing gas, is supplied to the gas distributor 4 and applied onto the wafer 1 through the gas-distributing slits of the adapter 4B, whereby high-pressure ashing is conducted on the semiconductor wafer 1.

In the meantime, the motor 22 drives the ball screw 21 in accordance with the drive signal supplied externally, which is periodically inverted in its polarity. Therefore, the direction in which the motor 22 rotates the ball screw 21 is reversed periodically. As a result of this, the gas distributor 4 is repeatedly moved back and forth for a distance of, for example, 4 cm, parallel to the surface of the semiconductor wafer 1, in the direction in which the gas-distributing slits and gas-exhausting slits of the adapter 4B are alternately arranged.

The motor 22 is controlled to change the speed the gas distributor 4 minutely, such that, as is shown in FIG. 11A, the distributor 4 is moved at constant speed, i.e., 3 mm/sec between speed-change points C and D located 5 to 10 mm away from points A and B, respectively, defining the distance for which the distributor 4 can be moved. The moment the distributor 4, moving to the left, reaches the point C, it is decelerated to stop at the point A, and the moment the distributor 4 stops at the point A, it is then moved to the right and accelerated to gain the constant speed upon reaching the point C. Similarly, the moment the distributor 4, moving to the right, reaches the speed-change point D, it is decelerated to stop at the point B, and the moment the distributor 4 stops at the point B, it is then moved to the left and accelerated to gain the constant speed upon reaching the speed-change point D.

The flow rate of the ashing gas is also controlled minutely. More specifically, as is shown in FIG. 11B, the solenoid valve 81 supplies the ashing gas at a predetermined flow rate (e.g., 20 l/min) while the distributor 4 is moving between the speed-change points C and D, at a flow rate decreasing while the distributor 4 is moving from the point C to the point A or from the point D to the point B, and at a flow rate increasing while the distributor 4 is moving from the point A to the point C or from the point B to the point D. As is result of this specific control of the flow rate, the gas distributor 4 applies the ashing gas to the wafer 2 uniformly, that is, in the same amount per unit area of the wafer 2.

The ozone remaining in the used ashing gas is decomposed by the exhaust gas filter 15, and the used gas, or the exhaust gas is supplied to the exhaust system (not shown) installed in the factory, under a predetermined pressure of, for example, 2 to 20 ata.

Upon lapse of a predetermined time during which the ashing gas has been applied to the semiconductor wafer 2, or upon detecting that the ozone content in the exhaust gas increases to a predetermined value, it is determined that the surface region of the wafer 2 has been ashed to a desired degree. Then, the high-pressure ashing is stopped, and the wafer 2, now ashed, is transferred from the ashing apparatus to a cleaning unit (not shown), where it is cleaned and cooled.

As has been described, the ashing gas is applied to the semiconductor wafer 2 while the distributor 4 is moved back and forth above the semiconductor wafer 2. This is very important. Were the distributor 4 not moved at all while applying the gas to the wafer 2, the gas could not be distributed uniformly to the entire surface of the semiconductor wafer 2. The gas would be distributed in a greater amount to those portions of the wafer 2 which are below the gas-distributing slits, than to those portions of the wafer 2 which are below the gas-exhausting slits. Further, as has been also described, the flow rate of the gas applied to the wafer 2 is changed in direct proportion to the speed of the distributor 5. This is also significant. Were the gas applied at the same flow rate regardless of the speed of the distributor 4, it would be applied excessively when the distributor 4 is moved at a low speed, and insufficiently when the distributor 4 is moved at a high speed. Since the ashing gas is applied while the distributor 4 is moving and at the flow rate directly proportional to the speed of the distributor 4, it is distributed to the entire surface of the wafer 2, in the same predetermined amount per unit area.

The secondary gas, which is mixed with the ozone-containing oxygen gas, thereby forming ashing gas, may be $N_2O$, $NO$, $NO_2$, $C_2F_6$, $CCl_4$, $CF_4$ or the like. A valve (not shown) is connected on the tube which connects the secondary gas exciting device 13 to the tube which connects the ozone generator 11 and the pressure raising device 9. This valve controls the flow rate of the secondary gas, changing the composition of the ashing gas. Since its composition can be adjusted, the ashing gas can be applied to the various types of the surface regions of semiconductor wafers.

As is illustrated in FIG. 12, no valves may be used to adjust the flow rate of the secondary gas, and a flow rate adjusting device 71 having a solenoid valve may be connected to the output of the ozone generator 11 only. In this case, the device 71 is controlled in accordance with the speed of the motor 22, that is, the speed of the gas distributor 4.

Furthermore, the ratio of ozone to the secondary gas may be reduced in inverse proportion to the speed of the gas distributor 4.

No solenoid valves may be used at all. Instead, the ozone generator 11 may be replaced with one which can generate ozone at a rate in proportion to the speed of the gas distributor 4.

The means for changing the flow rate of the ashing gas is not limited to a solenoid valve. Any other kind of a valve can be employed for this purpose.

In the ashing apparatus, described above, the speed of the gas distributor 4 is determined from the speed of the motor 22, and the flow rate of the ashing gas is controlled in accordance with the speed of the distributor 3, thus determined. Instead, the flow rate can be controlled in accordance with the position of the distributor 4 with respect to the points A and B (FIG. 11) between which the distributor 4 can be moved, and also with respect to the points C and D (FIG. 11) at which the speed of the distributor 4 is changed. If this is the case, position sensors are used to detect the position of the gas distributor 4.

Figure 11:
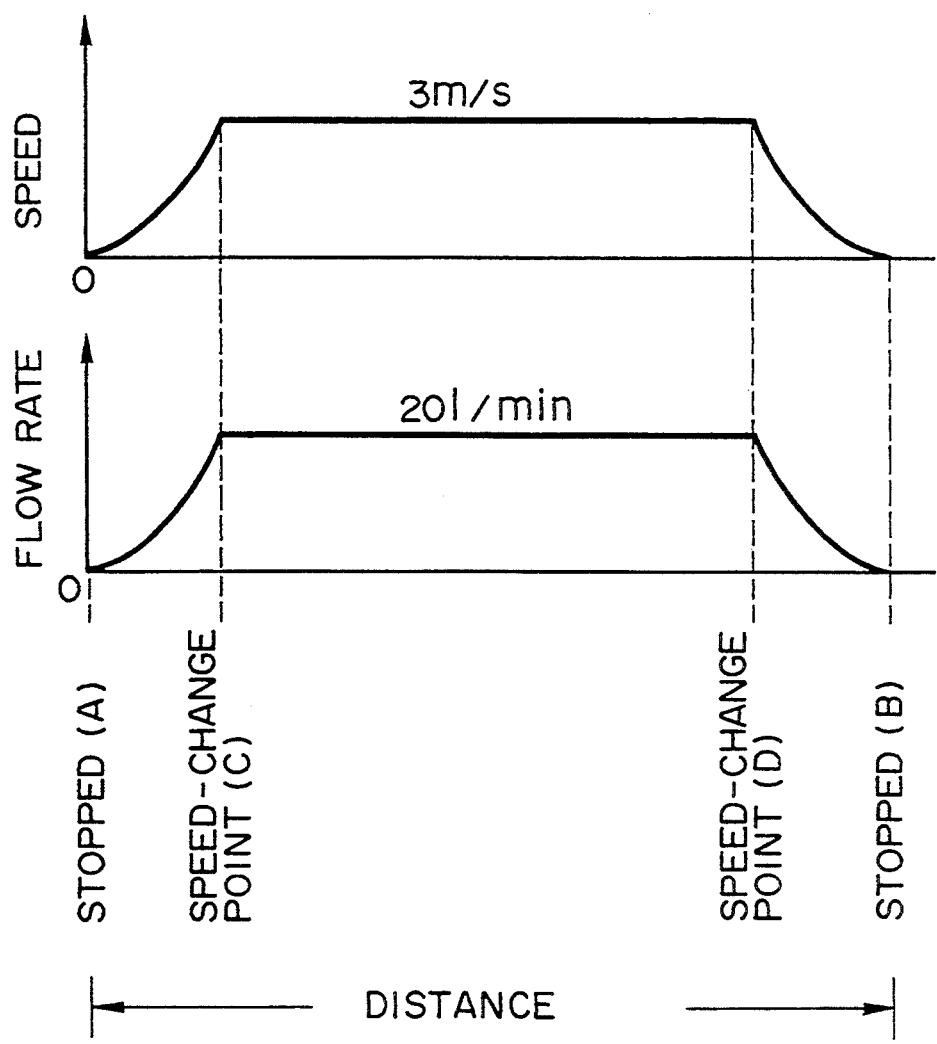
FIG. 11 is a timing chart explaining how the flow rate adjusting device operates to adjust the flow rate of ashing gas.

As has been described, the gas distributor 4 is moved back and forth between the points A and B (FIG. 11). Instead, the distributor 4 may apply the ashing gas to the wafer 2 while being moved in one direction only over the semiconductor wafer 2 for a predetermined ashing period. While being moved in the opposite direction, back to the initial position, the distributor 4 does not apply the gas at all. This specific method of applying the ashing gas results in the same advantage as the method described above.

Moreover, the heating plate 3 supporting the semiconductor wafer 2 may be moved, instead of moving the gas distributor 4. Alternatively, the heating plate 3 and the gas distributor 4 may be moved in the opposite directions.

The reaction chamber 1 may be sealed in airtight fashion in any means other than the sets of bellows 30 and 31 and the seal members 32 and 33.

The first embodiment of the invention, described above, is designed to ash a photoresist film formed on a semiconductor wafer. Nevertheless, the present invention can be applied to any apparatus which remove ink or a solvent from workpieces by oxidizing the ink or the solvent.

The ozone-containing gas used in the present invention is not limited to oxygen gas. It can be a mixture of ozone and an inert gas such as $N_2$, Ar, or Ne which does not react with ozone.

Furthermore, the workpieces are not limited to semiconductor wafers; they can be LCD substrates, photo-etching masks formed on glass substrates, printed circuit boards, or the like. The present invention is effective, in particular when it is applied to the ashing of ITO (Indium-Tin Oxide) film, amorphous silicon film, or the like, which can readily be oxidized and should be ashed under strict control so as not be excessively ashed to damage the coating underneath. (For example, the invention is effective in the case where a film must be ashed to have a reduced thickness, and then be removed by means of wet processing.)

Moreover, the present invention can be applied also to a cleaning apparatus which uses a cleaning gas such as HF, $ClF_3$ and so on and a CVD apparatus or an oxide film-forming apparatus, which uses TEOS (Tetra Ethoxy Silane) and ozone.

A preheating chamber may be connected to the input of the reaction chamber 1, and a cleaning unit may be connected to the output of the reaction chamber 1.

As has been explained, in the first embodiment, the gas distributor applies the processing gas to the surface of a workpiece while moving relative to the workpiece, whereby the gas is uniformly distributed onto the entire surface of the workpiece, thus processing every portion of the surface region of the workpiece to the same degree.

In addition, since the gas is applied under high pressure, the work piece can be processed at high speed. Since the junction between the reaction chamber and the mechanism for moving the gas distributor relative to the workpiece is sealed in airtight fashion, the reaction chamber remains sufficiently airtight.

Embodiment 2

FIG. 9 is a sectional view showing the main section of an ashing apparatus according to a second embodiment of the present invention. As is evident from this figure, the apparatus comprises a heating plate 61 located within a reaction chamber (not shown), and a gas distributor 62 also located within the reaction chamber and above the heating plate 61.

The plate 61 supports a LCD substrate 60, which is a workpiece to be ashed and which is held by means of a vacuum chuck or the like (not shown). A heater (not shown) is embedded in the plate 61, for heating the plate 61 to a desired temperature.

The gas distributor 62 is a generally rectangular hollow block having a gas-supplying slit 63 formed in the top wall, and a gas-applying slit 64 formed in the bottom wall. Both slits 63 and 64 communicate with the interior, which is a gas-exciting chamber 65. The distributor 62 has an elongated ultraviolet-ray source 66 (e.g., an ultraviolet lamp) provided within the chamber 65 and extending in the lengthwise direction thereof. The ray source 66 emits ultraviolet rays, which excite the ashing gas supplied into the chamber 65 via the slit 63. The gas distributor 62 has a coolant passage 67 which surrounds the gas-exciting chamber 65. A coolant flows through the passage 67, thus controlling the temperature of the gas distributor 62.

The gas-exciting chamber 65 extends in the lengthwise direction of the distributor 62 and has a rectangular cross section. It has a width greater than that of the slit 63. Hence, the ashing gas flowing through the slit 63 is quickly dispersed upon entering the gas-exciting chamber 65. The gas, thus dispersed, is excited by the ultraviolet rays emitted from the ray source 66 and thus heated to a predetermined temperature, and is then applied through the slit 64 to the LCD substrate 60. The gas distributor 62 is moved back and forth, in parallel to the surface of the LCD substrate 60 and in a line extending at right angle to the gas-applying slit 64. The heating plate 61 may be moved in the same manner, instead of the gas distributor 62. Alternatively, the plate 61 and the distributor 62 may be moved in the opposite directions.

It will now be explained how the ashing apparatus shown in FIG. 9 is operated to perform ashing on LCD substrates.

First, either the heating plate 61 or the gas distributor 62 is moved vertically by means of a lift (not shown), whereby the plate 61 and the distributor 62 are spaced apart for a predetermined distance. Then, an LCD substrate 60 is plated and fixed on the heating plate 61. The heating plate 61 or the gas distributor 62 is further moved vertically by the lift, whereby the substrate 60 and the distributor 62 and spaced apart for a distance of about 1 to 2 mm.

Next, the plate 61 is heated such that its surface temperature rises to about 200° C. The LCD substrate 60 is thus heated to the same temperature. Then, the gas distributor 62 is moved parallel to the surface of the LCD substrate 60, while applying the ozone-containing ashing gas uniformly to the surface of the LCD substrate 60. The ashing gas is already excited by the ultraviolet rays emitted from the ray source 66. The ozone is thermally decomposed upon contacting the heated LCD substrate 60 heated to about 200° C., thus generating a great amount of oxygen-atom radicals. These radicals react with the resist film formed on the substrate 60, thus ashing the resist film. As a result, the resist film is removed from the LCD substrate 60.

The gas distributor 62 is compact, and helps to make the ashing apparatus small. Further, it efficiently applies the ashing gas uniformly to the LCD substrate 60, thus serving to enhance the throughout of the ashing process.

The second embodiment is an ashing apparatus. However, it can be used as an etching apparatus, a CVD apparatus or a cleaning apparatus.

Embodiment 3

Figure 13:
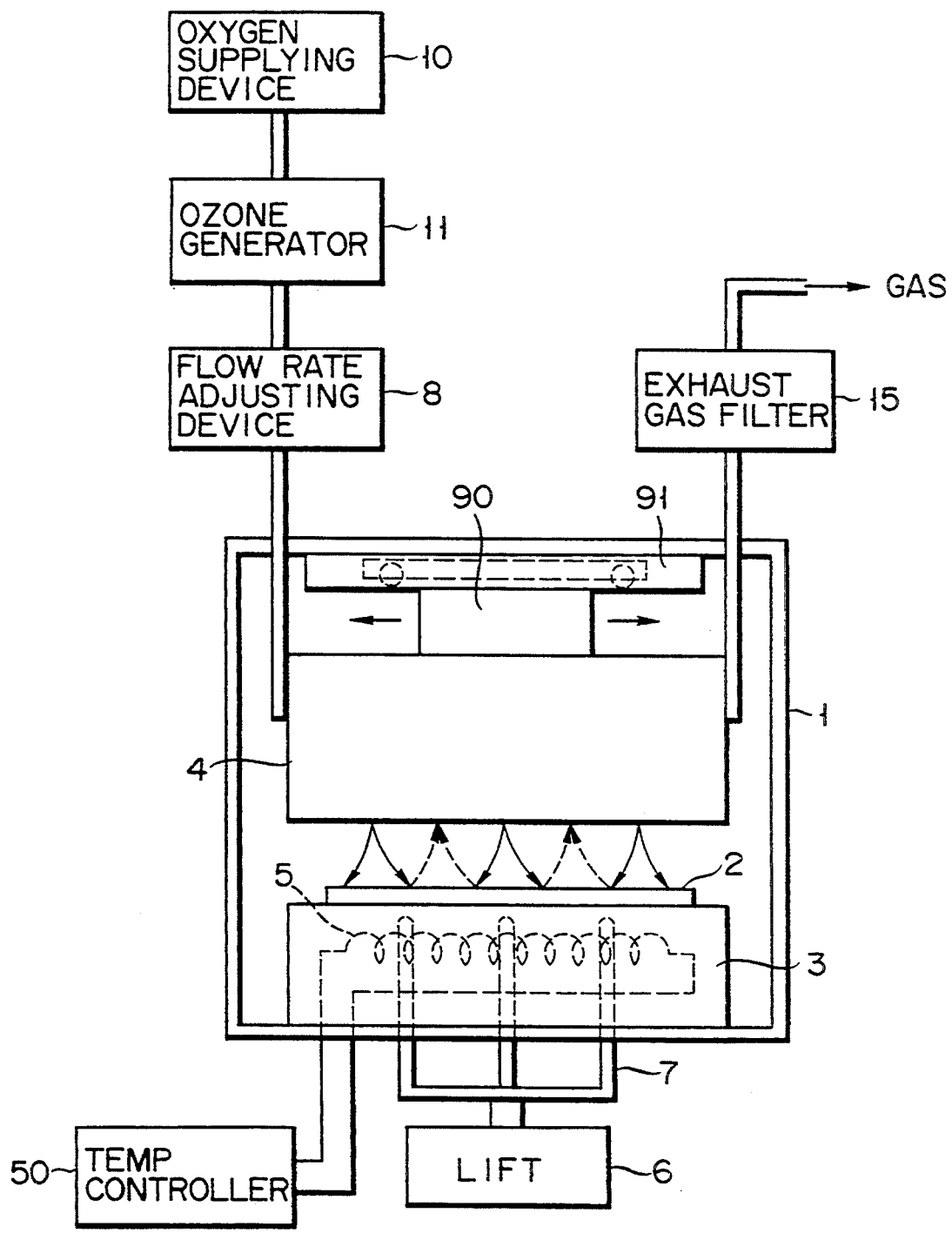
FIG. 13 is a side view illustrating a processing apparatus according to a third embodiment of this invention.
Figure 14:
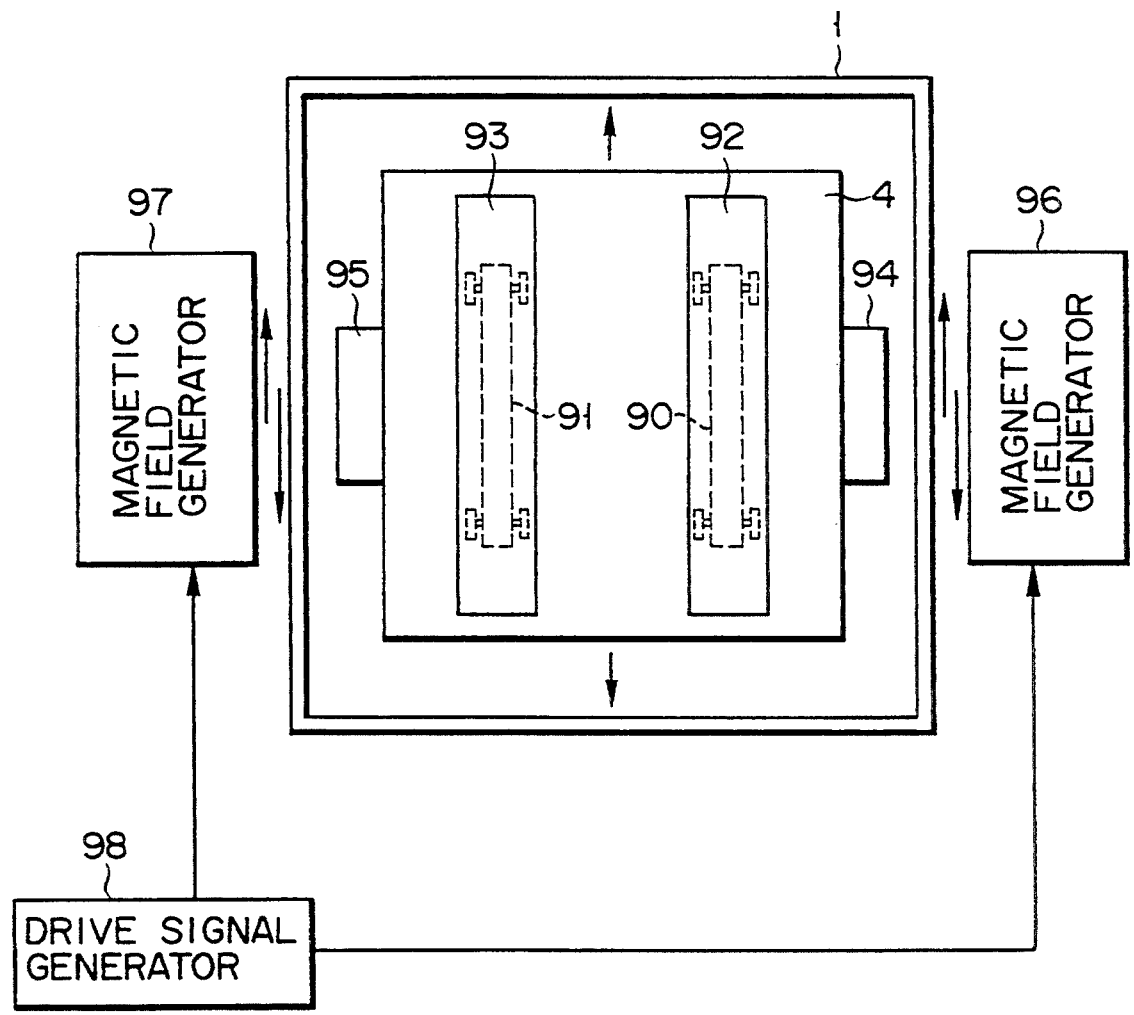
FIG. 14 is a plan view of the processing apparatus illustrated in FIG. 13.

FIG. 13 is a side view of an ashing apparatus according to a third embodiment of the invention, and FIG. 14 is a plan view thereof. The same components as those of the first embodiment are designated by the same numerals in FIGS. 13 and 14, and will not be described in detail.

As is shown in FIG. 13, the ashing apparatus comprises a reaction chamber 1, a heating plate 3 located within the chamber 1, and a gas distributor 4 located within the chamber 1 and above the heating plate 3. A semiconductor wafer 2, or a workpiece, is placed on the heating plate 3.

The heating plate 3 is made of a metal such as stainless steel (SUS) or aluminum. An electric heater 5 is embedded in the plate 3, for heating the plate 3 when heated by the heater 5, the plate 3 heats the semiconductor wafer 2 placed on it. The bottom of the chamber 1 and the heating plate 3 have several through holes (e.g., three holes). Several vertical pins 7 (e.g., three pins) are inserted in these holes, and are connected, at the lower end, to a substrate lift 6 which is located below the chamber 1. The lift 6 is designed to move the pins 7 upward and project them from the upper surface of the plate 3, thereby to unload the wafer 2 from the plate 3, and also to move the pins 7 downward and pull them back into the holes, thereby to load the wafer 2 onto the plate 3.

The gas distributor 4 has gas-distributing slits (not shown) and gas-exhausting slits (not shown, either), which are alternately arranged in parallel to one another. The gas-distributing slits are connected to a flow rate adjusting device 8. The device 8 is coupled to an ozone generator 11, which in turn is connected to an oxygen supplying device 10. The ozone generator 11 generates ozone by means of silent discharge, corona discharge, or glow discharge. The gas-exhausting grooves of the gas-distributor 4 are coupled to an exhaust gas filter 15. The exhaust gas filter 15 is connected to an exhaust system installed in a factory.

Two suspensions 90 and 91 are connected at lower end to the top of the gas distributor 4. The upper ends of these suspensions 90 and 91 each have wheels, which rest in the grooves made in guide rails 92 and 93 which are fastened to the inner surface of the top wall of the reaction chamber 1. Hence, the gas distributor 4 can be moved in the directions of the arrows shown in FIGS. 13 and 14, that is, in a line extending at right angles of the gas-distributing and -exhausting slits. The gas distributor 4 is moved by a kind of a linear motor. The linear motor comprises a pair of permanent magnets 94 and 95, and a pair of magnetic-field generators 96 and 96, as is shown in FIG. 14. The magnets 94 and 95 are attached to those sides of the distributor 4 which are parallel the guide rails 92 and 93, and the magnetic-field generators 96 and 97 are located outside the chamber 1 and opposing the magnets 94 and 95, respectively. A drive signal generator 89 is provided outside the reaction chamber 1, and supplies drive signals to the magnetic-field generators 96 and 97. Driven by these signals, the generators 96 and 97 generates two magnetic fields which extend parallel to the guide rails 92 and 93. The direction of these magnetic fields is altered upon every lapse of a predetermined time. Hence, the gas distributor 4 is periodically moved back and forth.

The ashing apparatus shown in FIGS. 13 and 14 ashes the semiconductor wafer 2, exactly in the same way as the ashing apparatus shown in FIG. 1. It will therefore now be explained in detail how the permanent magnets 94 and 95 and the magnetic-field generators 96 and 97 cooperate to move the distributor 4 back and forth.

First, the drive signal generator 98 supplies drive signals to the magnetic-field generators 96 and 97, whereby the generators 96 and 97 generate magnetic fields which extend alternately in two opposite directions. The magnetic fields extending in the first direction attract the magnets 94 and 95 attached to the opposing sides of the distributor 4, whereas the magnetic field extending in the second direction repels the magnets 94 and 95. As a result of this, the gas distributor 4 is moved back and forth for a distance of, for example, 10 to 50 mm, in a line intersecting with the gas-distributing and -exhausting slits of the distributor 4.

As has just been described, the ashing gas is applied to the wafer 2 while the distributor 4 is moved back and forth above the wafer 2. This is very important. Were the distributor 4 not moved at all while applying the gas to the wafer 2, the gas could not be distributed uniformly to the entire surface of the semiconductor wafer 2. The gas would be distributed in a greater amount to those portions of the wafer 2 which are below the gas-distributing slits, than to those portions of the wafer 2 which are below the gas-exhausting slits. Since the ashing gas is applied to the wafer 2 while the gas distributor 4 is moving, it is distributed to the entire surface of the wafer 2, in the same amount per unit area.

Since the gas distributor 4 is moved by a linear motor, i.e., magnetic means, and no mechanical members pass through the walls of the chamber 1, or connected to the distributor 4, in order to move the gas distributor 4, it is unnecessary to use whatever sealing members to prevent the ozone-containing reaction gas from the chamber 1.

As has been described, the gas distributor 4 is moved back and forth while applying the ashing gas to the wafer 2. Instead, it may apply the gas to the wafer 2 only while being moved in one direction only or rotated over the wafer 2 for a predetermined ashing period.

Embodiment 4

Figure 15:
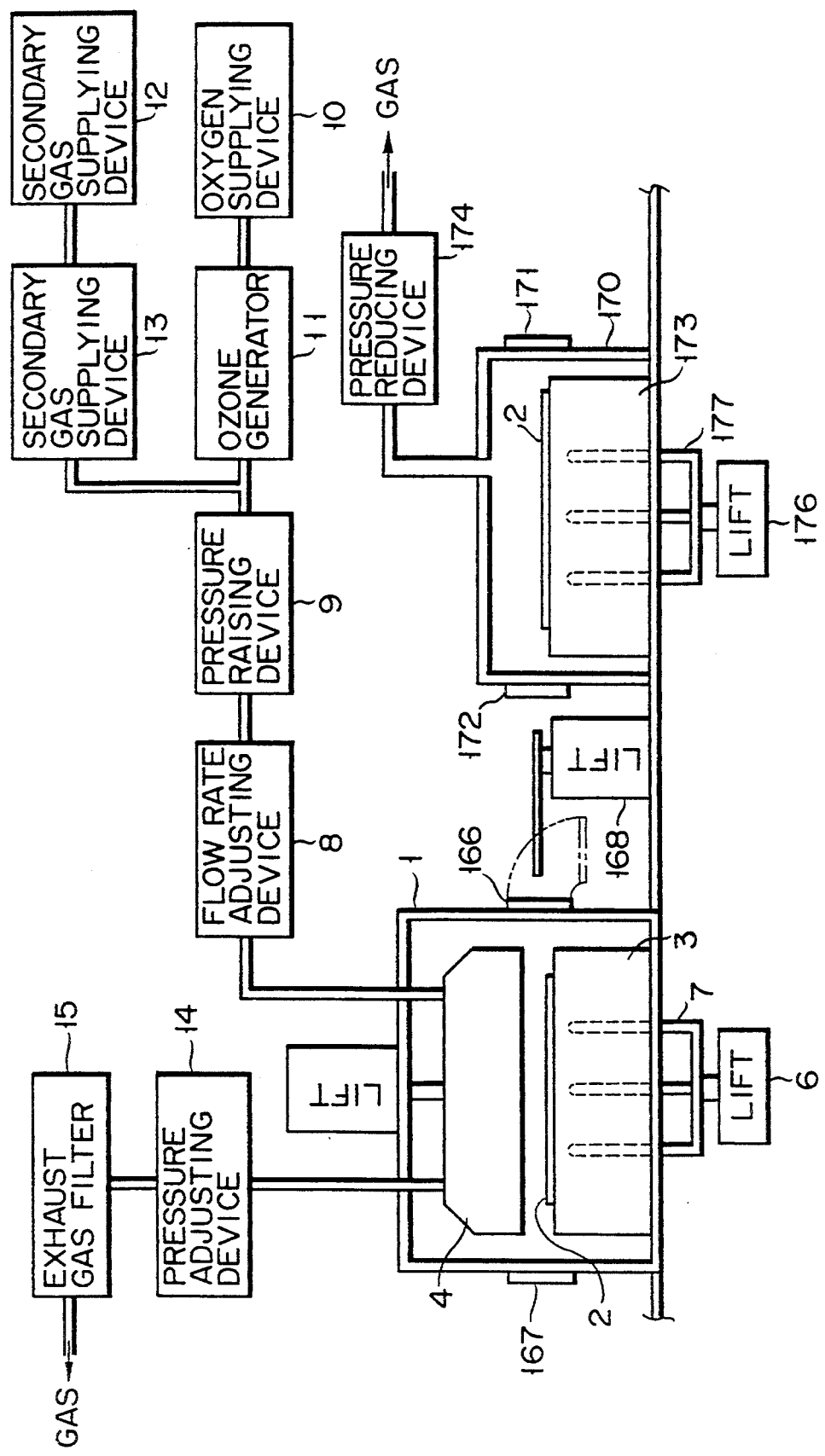
FIG. 15 is a side view showing a processing apparatus according to a fourth embodiment of the present invention.
Figure 16:
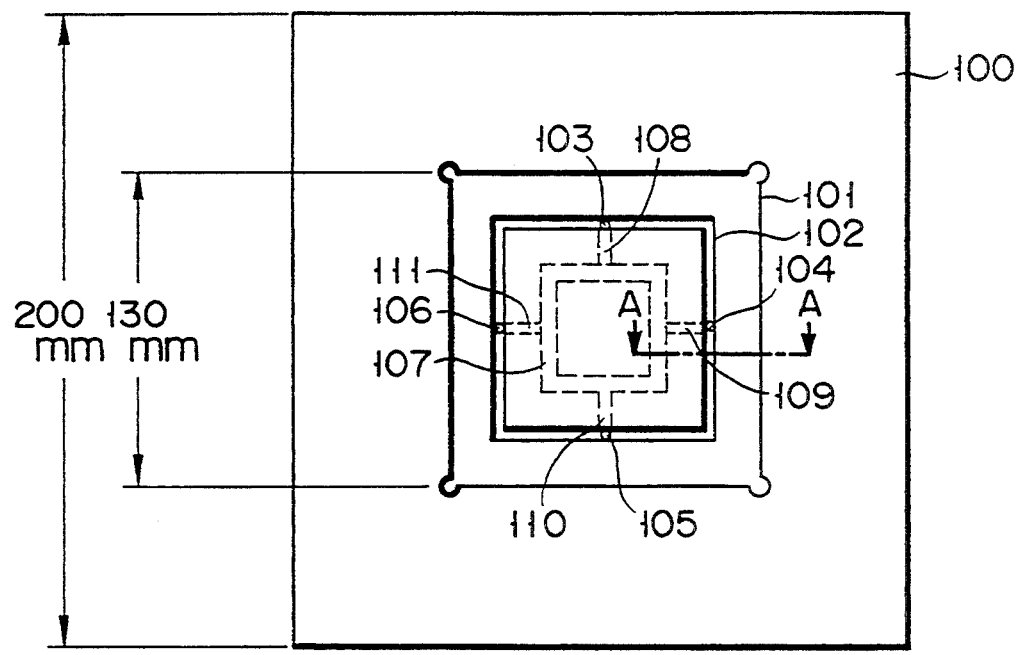
FIG. 16 is a plan view of a tray used in the processing apparatus shown in FIG. 15.
Figure 17:
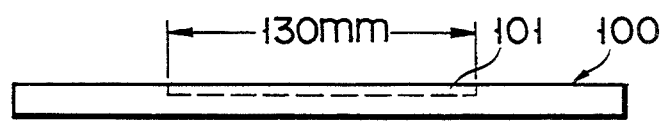
FIG. 17 is a side view of the tray.
Figure 18:
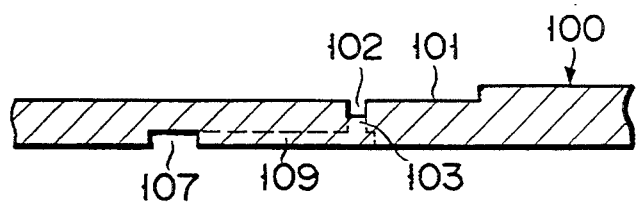
FIG. 18 is a sectional view of the tray, taken along line A—A in FIG. 16.

FIG. 15 illustrates still another ashing apparatus according to a fifth embodiment of this invention, which is identical to the first embodiment (FIG. 1), except that use is made of a tray 100 shown in FIGS. 16, 17, and 18. FIG. 16 is a plan view of the tray 100, FIG. 17 is a sectional view of the tray 100, and FIG. 18 is a sectional view of the tray 100, taken along line A—A.

As may be understood from FIG. 16, the tray 100 is a square plate, each side being 200 mm long. It has a square recess 101 formed in the top surface having sides, each 130 mm long. A frame-like groove 102 is made in the bottom of the recess 101 and positioned concentric with the recess 101. Four through holes 103 to 106 are made in the four straight portions of the groove 101, respectively. Further, a frame-like groove 107 is made in the lower surface, having a width of 2 mm and a depth of 1 mm. The shape of this groove 107 corresponds, not identical, to the vacuum-suction groove made in the top surface of a heating plate 3. Four straight grooves 108 to 111 are formed in the lower surface of the tray 100, connecting the frame-like groove 107 to the through holes 103 to 106, and hence to the frame-like groove 102 formed in the top surface of the tray 100.

A square LCD substrate, each side being 130 mm, is fitted in a square, shallow recess 101 formed in the lower surface of the tray 100 and concentric with the frame-like groove 107. The tray 100, with the LCD substrate thus fitted in the recess 101, is introduced into the ashing chamber, so as to ash the LCD substrate in the chamber 1.

To ash a smaller, secure LCD substrate, each side being, for example, 100 mm long, use is made of the tray 120 shown in FIGS. 19 and 20. The tray 120 is similar in structure to the tray 100. It has a square, shallow recess 121 formed in the top surface having having sides, each being 100 mm long. A frame-like groove 122 having sides, each 80 mm long, a width of 1 mm and a depth of 1 mm is formed in the bottom of the recess 121 and located concentric with the recess 121. The recessed portion of the tray 120 has four through holes 123 to 126. A frame-like groove 127 is formed in the lower surface of the tray 120, and four straight grooves 128 to 131 connected to the groove 127 are also formed in the lower surface. Hence, the frame-like groove 127 is connected to the frame-like groove 122 by the grooves 128 to 131 and through holes 123 to 126. A square LCD substrate, each side being 100 mm, is fitted in a square, shallow recess 121 formed in the lower surface of the tray 120 and concentric with the frame-like groove 127. The tray 120, with the LCD substrate thus fitted in the recess 121, is introduced into the ashing chamber 1, so that the LCD substrate is ashed in the chamber 1.

As a comparison between FIGS. 16 and 19 may reveal, the frame-like groove 127 formed in the lower surface of the tray 120 has the same size as the groove 107 formed in the lower surface of the tray 100, where as the square recess 121 and frame-like groove 122, both formed in the top surface of the tray 120 have deferent in size from their equivalents 101 and 102 of the tray 100. Hence, the frame-like groove made in the lower surface of either tray can be connected to the vacuum-suction groove made in the top surface of a heating plate 3.

It will now be explained how the ashing apparatus shown in FIG. 15 perform ashing on LCD substrates.

A number of workpieces, each consisting of a tray 100 of the type shown in FIG. 16 and an LCD substrate 2 fitted in the square recess 101, are supplied, one by one, from a sender (not shown) to a preheating chamber 170 by means of a conveyer (not shown, either). The preheating chamber has two doors, i.e., a front door 171 and a back door 172, and a heating plate 173. When a tray 100 reaches the chamber 170, the door 171 opens. The tray 100 enters the chamber 170 through the front door 171, and placed on the tips of pins 175 projected upward from the plate 173 by means of a lift 176. The pins 175 are then lowered below the top surface of the plate 173 by means of the lift 176, whereby the tray 100 is placed on the heating plate 173.

When the tray 100 is placed on the plate 173, the frame-like groove 107 of the tray 100 communicates with the vacuum-section groove made which is formed in the top surface of the plate 173 and which is connected to a vacuum pump (not shown). The vacuum pump is driven, drawing air from the chamber 170 through the frame-like groove 102, through holes 103 to 106, the straight grooves 107 to 111, and the frame-like groove 107. As a result of this, the LCD substrate 2 is fixed steadily in the square recess 101.

Then, the front door 171 is automatically closed. The pressure within the chamber 170 is reduced to a predetermined value, e.g., 0.1 to 10 Torr. The plate 173 heats the LCD substrate 2, fitted in the tray 100, to a predetermined temperature, for example, 50° to 150° C. for a few minutes, whereby the solvent is removed from the photoresist formed on the LCD substrate within a short time. (Since the LCD substrate is preheated, it will be heated to an ashing temperature within a shorter time than otherwise.)

Upon completion of the preheating, the back door 172 is automatically opened. A transfer device 168, located at the back of the preheating chamber 170, transfers the tray 100 with the preheated LCD substrate placed on it, from the chamber 170 to the ashing chamber 1. The heating plate 3 located within the chamber 1 has been heated to a predetermined temperature, for example, 150° to 250° C. during the preheating process. If the ashing apparatus is to perform continuous ashing, the first tray 100, with the LCD substrate 2 fitted in it, must be preheated and made ready to be transferred into the ashing chamber 1 immediately after the plate 3 is heated to the predetermined temperature, so as to obtain a sufficient high throughput of the ashing process.

The ashing chamber 1 has a front door 166 and a back door 167. When the temperature of the heating plate 3 rises to the predetermined value, the front door 166 is automatically opened. The transfer device 168 is then further operated, thus transferring the tray 100 with the preheated LCD substrate 2 fitted in it, into the ashing chamber 1. Then, the front door 166 is closed. Next, in the ashing chamber 1, high-pressure ashing is performed on the LCD substrate 2 in the same way as in the first embodiment.

Thereafter, an inert gas, such as nitrogen gas, is purged into the ashing chamber 1. Then, the back door 167 is opened, and the tray 100 with the ashed LCD substrate fitted in it is transferred from the ashing chamber 1. The tray 100 is then set in a cleaning chamber (not shown) and placed on the cleaning plate located within the cleaning chamber. Then, the LCD substrate 2 is cleaned, and the tray 100 is transferred from the cleaning chamber to a receiver (not shown).

To ash a square LCD substrate whose each side is, for example, 100 mm, and which is smaller than the LCD substrate 2 fitted in the tray 120, this LCD substrate is fitted in the tray 120 shown in FIG. 19. This tray 120, is introduced from the sender into the preheating chamber 170, and hence into the ashing chamber 1. Hence, the LCD substrate fitted in the tray 120 is preheated in the chamber 170 and then ashed in the chamber 1, in the same way as the LCD substrate 2 fitted in the tray 100.

As has been described above, the processing apparatus according to the present invention can process workpieces of various sizes and different shapes to a desired degree, since use is made of trays of the same size and the same shape for holding these workpieces.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A processing apparatus for removing an organic surface layer from a workpiece, by ashing the surface layer with an ashing reaction gas, said apparatus comprising:
a reaction chamber;
a workpiece-supporting section located in said reaction chamber, said workpiece supporting section having a workpiece supporting surface for supporting a workpiece;
a gas distributor located in said reaction chamber and facing said workpiece-supporting section, for distributing a reaction gas for removing the surface layer of the workpiece that faces the gas distributor;
a gas-supply means for supplying said reaction gas into said reaction chamber through said gas distributor; and
driving means for producing back and forth relative movement between said gas distributor and said workpiece-supporting section, in a direction parallel to the supporting surface of said workpiece-supporting section to uniformly supply said reaction gas to the surface layer of said workpiece,
wherein said gas distributor has a gas distributor surface opposing the supporting surface of the workpiece supporting section, said gas distributor surface has a first plurality of parallel slits for distributing the ashing reaction gas, each of said first plurality of parallel slits extending in a first direction, said gas distributor surface has a second plurality of parallel slits for exhausting gas, each of said second plurality of parallel slits extending in the first direction, wherein the first plurality of parallel slits are parallel to the second plurality of parallel slits, and slits of the first and second pluralities are alternately provided along a direction that is perpendicular to the first direction;
wherein said direction of relative movement is perpendicular to said first direction;
wherein said driving means is capable of providing said back and forth relative movement so that the ashing reaction gas is uniformly distributed to the entirety of said organic surface layer.

2. A processing apparatus according to claim 1, further comprising:
a pulse encoder for adjusting a rate of flow of said reaction gas from said gas-supply means to said gas distributor.

3. The apparatus according to claim 1, further comprising:
activating means for activating said reaction gas; and
cooling means for cooling the reaction gas, thereby controlling the temperature of said activated reaction gas, said cooling means being provided in said gas distributor.

4. The apparatus according to claim 1, wherein an internal pressure of said reaction chamber is maintained at 2 to 20 ata.

5. A processing apparatus according to claim 1, wherein said gas-supply means comprises a pressure raising device for raising the pressure of the reaction gas prior to supplying the reaction gas to the reaction chamber.

6. A processing apparatus, comprising:
a reaction chamber;
a workpiece-supporting section having a supporting surface for supporting a workpiece and located in said reaction chamber;
a gas distributor that is located in said reaction chamber and that is facing said workpiece-supporting section, said gas distributor for distributing ashing reaction gas to the workpiece when the workpiece is placed on the supporting surface of said workpiece-supporting section;
a gas-supplying means for supplying the ashing reaction gas into said reaction chamber through said gas distributor;
driving means for producing back and forth relative movement between said gas distributor and said workpiece-supporting section, said back and forth relative movement being in a direction that is parallel to the supporting surface of said workpiece-supporting section to thereby uniformly supply said ashing reaction gas to an organic surface layer of said workpiece;
wherein said gas distributor has a gas distributor surface opposing the supporting surface of the workpiece-supporting section, said gas distributor surface has a first plurality of parallel slits for distributing said ashing reaction gas, each of said first plurality of parallel slits extending in a first direction, said gas distributor surface has a second plurality of parallel slits for exhausting gas, each of said second plurality of parallel slits extending in said first direction, wherein the first plurality of parallel slits are parallel to the second plurality of parallel slits, and slits of the first and second pluralities are alternately provided along a direction that is perpendicular to the first direction;
wherein said back and forth relative movement is in a direction that is perpendicular to said first direction;
wherein said driving means is capable of providing said back and forth relative movement so that the ashing reaction gas is uniformly distributed to the entirety of said organic surface layer;
wherein a distance between said gas distributor surface and said workpiece-supporting section is set at between 1 and 2 mm.

7. A processing apparatus, comprising:
a reaction chamber;
a workpiece-supporting section that is located in said reaction chamber and having a supporting surface for supporting a workpiece;
a gas distributor located in said reaction chamber and facing said workpiece-supporting section, said gas distributor for distributing reaction gas to a facing surface of a workpiece placed on the supporting surface which faces said gas distributor;
a gas-supplying means for supplying the reaction gas into said reaction chamber through said gas distributor;
driving means for producing relative movement between said gas distributor and said workpiece-supporting section, said relative movement being in a direction that is parallel to the supporting surface of said workpiece-supporting section to thereby uniformly supply said reaction gas to said facing surface of said workpiece;
control means for controlling the flow rate of the reaction gas in accordance with the speed of the relative movement between the gas distributor and the workpiece-supporting section;
wherein the control means comprises means for decreasing the relative speed of movement in a beginning period and near an end period of said relative movement and for lowering the flow rate of gas in accordance with said decreased speed;

wherein said gas distributor has a gas supply face which faces the supporting surface of the workpiece-supporting section;

wherein a gas supply port for supplying gas to said reaction chamber and a gas exhaust port for exhausting gas from said reaction chamber are formed in said gas supply face; and wherein a distance between said gas supply face of said gas distributor and said supporting surface of said workpiece-supporting section is between 1 and 2 mm, whereby a prompt supply of reaction gas through said gas supply port and a prompt exhaust of gas through said gas exhaust port is achieved.

8. The apparatus according to claim 7, wherein said gas distributor is provided with a plurality of gas supply ports and gas exhaust ports, said gas supply ports and gas exhaust ports being arranged alternately.

9. The apparatus according to claim 8, wherein each of said gas supply ports and gas exhaust ports is in the form of a slit extending in a direction perpendicular to the moving direction of said gas distributor.

10. A processing apparatus for removing a surface layer of a workpiece, one workpiece at a time, by ashing the surface layer with an ashing reaction gas, said apparatus comprising:

a reaction chamber;

a workpiece-supporting section having a supporting surface for supporting a workpiece and located in said reaction chamber;

a gas distributor located in said reaction chamber and facing said workpiece-supporting section, for distributing a reaction gas for removing the surface layer of the workpiece on the workpiece-supporting section;

a gas-supply means for supplying said reaction gas into said reaction chamber when said reaction chamber is under a pressurized atmosphere;

driving means for producing relative movement between said gas distributor and said workpiece-supporting section, in a direction that is parallel to the supporting surface of said workpiece-supporting section, to uniformly supply said reaction gas to the surface layer of said workpiece, whereby the surface layer of said workpiece is uniformly removed by reaction with said reaction gas;

control means comprising means for decreasing the relative speed of movement in a beginning period and near an end period of said relative movement and for lowering the flow rate of gas in accordance with said decreased speed;

wherein said gas distributor has a gas supply face which faces said supporting surface of the workpiece-supporting section;

wherein a gas supply port for supplying gas to said reaction chamber and a gas exhaust port for exhausting gas from said reaction chamber are formed in said gas supply face; and wherein a distance between said gas supply face of said gas distributor and said supporting surface of said workpiece-supporting section is between 1 and 2 mm, whereby a prompt supply of reaction gas through said gas supply port and a prompt exhaust of gas through said gas exhaust port is achieved.

11. The apparatus according to claim 10, further comprising:

activating means for activating said reaction gas; and cooling means for cooling the reaction gas, thereby controlling the temperature of said activated reaction gas, said cooling means being provided in said gas distributor.

12. The apparatus according to claim 10, wherein an internal pressure of said reaction chamber is maintained at 2 to 20 ata.

13. The apparatus according to claim 10, wherein said gas distributor is provided with a plurality of gas supply ports and gas exhaust ports, said plurality of gas supply ports and gas exhaust ports being arranged alternately.

14. The apparatus according to claim 13, wherein each of said plurality of gas supply ports and gas exhaust ports is in the form of a slit extending in a direction that is perpendicular to the moving direction of said gas distributor.

* * * * *